United States Patent [19]

Goldberg

[11] Patent Number: 5,112,434
[45] Date of Patent: May 12, 1992

[54] METHOD FOR PATTERNING ELECTROLESS METAL ON A SUBSTRATE FOLLOWED BY REACTIVE ION ETCHING

[75] Inventor: Robert L. Goldberg, Sharon, Mass.

[73] Assignee: Shipley Company Inc., Newton, Mass.

[21] Appl. No.: 672,402

[22] Filed: Mar. 20, 1991

[51] Int. Cl.$^5$ .............. B44C 1/22; H01L 21/306; C23F 1/00; B29C 37/00

[52] U.S. Cl. .................. 156/628; 156/643; 156/655; 156/656; 156/657; 156/659.1; 156/662; 156/668; 427/43.1; 427/53.1; 427/98

[58] Field of Search ........... 156/628, 643, 655, 656, 156/657, 659.1, 662, 668; 252/79.1; 427/43.1, 53.1, 98, 305, 385.5, 404; 430/313, 315, 319, 324; 204/192.37

[56] References Cited

U.S. PATENT DOCUMENTS

| | | | |
|---|---|---|---|
| 4,426,247 | 1/1984 | Tamamura et al. | 156/643 |
| 4,613,398 | 9/1986 | Chiong et al. | 156/628 |
| 4,701,351 | 10/1987 | Jackson | 427/98 |
| 4,981,715 | 1/1991 | Hirsch et al. | 427/53.1 |

*Primary Examiner*—William A. Powell
*Attorney, Agent, or Firm*—Robert L. Goldberg

[57] ABSTRACT

This invention describes methods for altering a substrate in a fine line image pattern using microlithographic processes including formation of a metal mask over a polymer coating to protect the coating during dry development of the same. A substrate is first coated with a polymer suitable for complexing noble metal compounds. The substrate is then complexed with a noble metal compound, such as by contact with a palladium salt, selectively irradiated to form the desired conductor pattern, and then etched so that the desired pattern remains. The substrate is subsequently placed in an electroless plating bath to form a metal mask. Alternatively, before applying the noble metal compound, a substrate immersed in a polymer solution suitable for complexing a noble metal compound can be selectively irradiated to selectively deposit polymer on the substrate, followed by applying a noble metal compound and electroless plating to form the desired mask.

22 Claims, No Drawings

METHOD FOR PATTERNING ELECTROLESS METAL ON A SUBSTRATE FOLLOWED BY REACTIVE ION ETCHING

BACKGROUND OF THE INVENTION

I. Introduction

This invention relates to microlithography, and more particularly, to a process of microlithography that uses a photoresist coating protected by a metal mask. Specifically, the invention relates to the formation of a patterned metal mask over a photoresist coating, and the use of the mask to dry develop the photoresist coating and/or transfer an image defined by a developed photoresist coating to an underlying substrate.

II. Discussion of Related Art

Recent advances in electronic device fabrication have resulted from improvements in manufacturing techniques, especially improvements in microlithographic methods and methods for transferring patterns from a master to a substrate utilizing a patterned photoresist. For fine line patterning, anisotropic dry development with a reactive ion etch is preferred to wet development because anisotropic etching results in a relief image having vertical side walls. This permits transfer of an image of enhanced resolution to an underlying substrate.

Photoresists used in processes of the above type are organic polymers often containing a separate light sensitive component. Contact of an organic coating with an oxygen plasma causes erosion or ablation of all surfaces of the coating contacted by the plasma stream. For this reason, to create an image pattern in a photoresist coating by dry development with a plasma, the photoresist coating must have areas that are plasma resistant and other areas that are not plasma resistant, the plasma resistant areas and the areas subject to attack by the plasma defining the desired image pattern.

Methods for dry development of photoresist coatings in an image pattern are known in the art. For example, a known method for formation of a plasma resistant photoresist coating in an image pattern involves use of a photoresist containing silicon as part of the photoresist composition in sufficient quantity whereby following exposure to patterned activating radiation and upon contact with a plasma, a silicon oxide mask is formed over the surface of the photoresist, the silicon oxide mask functioning as a patterned protective layer that limits erosion of those portions of the photoresist coating underlying the silicon oxide mask.

A method for generating a pattern in a photoresist coating using a technique similar to that described above is disclosed in U.S. Pat. No. 4,426,247. The method comprises the steps of forming a polymer layer on a substrate, forming a silicon layer on the polymer layer, selectively irradiating a surface of the silicon layer with a high energy beam, exposing the surface of the silicon layer to a radical addition polymerizable monomer gas so as to form a graft polymer film as a mask on an irradiated portion of the surface of the silicon layer, performing reactive ion etching using the graft polymer film as a mask so as to form a silicon pattern, and a reactive ion etching using the silicon pattern as a mask to protect underlying organic polymer layers, so as to form an organic polymer pattern.

More recent processes have been developed that permit selective conversion of portions of a nonsilicon containing photoresist to a silicon containing etch resistant mask. In these methods, the nonsilicon containing photoresist is exposed to patterned radiation to create a latent image within the photoresist. The latent image is then reacted with an organometallic reagent to incorporate an oxide forming element such as a metal or silicon into the image. The metallized or siliconized latent image is then dry developed, and etch resistant images, as well as underlying organic material, if any, can be dry developed using a suitable plasma to sequentially develop and transfer the pattern to a substrate below. Such methods are disclosed in U.S. Pat. No. 4,613,398. As disclosed in that patent, the metallic portion of the organometallic material can be selected from the Group III A metals, Group IV A metals, Group IV B metals, and Group VI B metals. The preferred elemental portions are disclosed as titanium, silicon and tin, with the most preferred being silicon.

Though the methods described above yield etch resistant photoresist layers, results are not readily reproducible and the processes are cumbersome, time consuming and costly. Therefore, there is a continuing need for an improved process for providing dry etch resistant masks over photoresists for transfer of micron and submicron images to a substrate.

SUMMARY OF THE INVENTION

The present invention provides an improved method of patterning electroless plated metal on a polymer substrate wherein the metal serves as a plasma resistant mask for subsequent dry development of the coating. The terms polymer and photoresist will be used interchangeably throughout the application. In accordance with one aspect of the present invention, a substrate is coated with a polymer that binds tightly to the substrate. The polymer is then contacted with a seeding noble metal compound, for example, one containing palladium. The complexed polymer is then irradiated with a laser beam in a desired pattern. The substrate is then placed in a wet chemical etch to remove the non-irradiated regions. Finally, the substrate is exposed to a conventional electroless plating bath which results in a metal pattern that adheres well to the substrate.

In accordance with another aspect of the present invention, a substrate is coated with a mixture of a polymer that binds tightly to the substrate and a seeding noble metal compound, wherein the mixture forms a complexed polymer. The complexed polymer is then irradiated with a laser beam in a desired pattern. The substrate is then placed in a wet chemical etch to remove the non-irradiated regions. Finally, the substrate is exposed to a conventional electroless plating bath which results in a metal pattern that adheres well to the substrate.

In accordance with another aspect of the present invention, there is provided another method for preparing an electroless plated metal pattern. A substrate is immersed in an uncomplexed polymer solution and then the polymer is deposited on the substrate in those regions that are selectively irradiated. The substrate with the deposited pattern of polymer is then removed from the polymer solution and rinsed with deionized water to remove excess solution Thereafter a noble metal compound is applied to the patterned polymer and then the substrate is exposed to a conventional electroless plating bath.

The metal deposited by the above procedures is continuous and capable of functioning as a mask or barrier that protects the underlying polymer coating against erosion or ablation during a subsequent dry development step. For a process of mask formation, electroless deposition over a catalyzed surface using conditions favoring a thin metal deposit are preferred. A thin deposit is adequate because a metal deposit as thin as 80 angstroms is adequate to protect the photoresist coating during dry development. This is in contrast to conventional electroless plating procedures that generally require a relatively thick deposit (0.05 to 1 mil or greater) because the conventional deposit is most often used for conductivity in circuit manufacture or corrosion resistance as a protective coating. Thin metal deposits are an advantage as they permit reduced plating time or the use of dilute and more controllable plating solutions at reduced temperature and with enhanced edge acuity.

Following electroless deposition, remaining polymer unprotected by the metal mask is removed by dry development, preferably using an anisotropic reactive ion etchant. The metal mask over the polymer coating protects the polymer against attack during dry development. Using anisotropic dry development, there is formed a relief pattern where the features of the relief pattern are defined by vertical side walls known to be advantageous in submicron fabrication. Thereafter, the substrate that has been bared by the previous steps may be processed in an art recognized manner. Processing preferably comprises etching of the surface of the substrate with a plasma. The steps of dry development of the polymer and dry etching of the substrate may be sequential with etching immediately following dry development.

By the processes of the invention, dry development may be used to form developed photoresist images having submicron lines. This permits transfer of these fine line images to an underlying substrate using an additional etch step. The processes of the invention are especially useful for the fabrication of integrated circuits though the processes are also useful for the fabrication of a wide variety of devices.

DESCRIPTION OF THE PREFERRED EMBODIMENTS

In performing the method of the present invention, preferably the top surface of the substrate will be clean prior to the coating of the polymer layer to ensure good adhesion of the plated metal to the substrate. One such cleaning technique, for example, consists of exposing the substrate surface to an argon plasma in a vacuum chamber for 2.5 kW-minutes.

The substrate is next coated with a polymer which complexes with a noble metal compound. Such polymers include poly(acrylic acid) and polyacrylamid. The polymer layer can be applied by numerous techniques, such as dip coating, spray coating, spin coating or plasma deposition. In any case the polymer solution is dried to form a residual film. Preferably the substrate is coated with poly(acrylic acid), for example by placing a thin layer (approximately 1 millimeter) of 1% by weight aqueous poly(acrylic acid) onto a substrate and allowing the solution to dry in air while the substrate lies flat. After the solution has dried, typically in 15 to 30 minutes, a layer of poly(acrylic acid) approximately 1.5 microns thick remains on the substrate.

The next step is to contact the polymer layer with a liquid solution containing ions of an appropriate catalyst, such as a noble metal compound, so that the polymer will incorporate these ions and be catalytic for subsequent electroless plating of metal. Preferred noble metal compounds contain palladium, such as palladium salts including palladium (II) chloride, palladium (II) sulfate, or palladium acetyl-acetonate. The noble metal compound can be applied by numerous techniques, such as dip coating, spray coating from a solution of the noble metal compound or by exposure of the substrate to the vapor of the compound. Following this treatment the substrate is preferably rinsed and dried. In the preferred embodiment 0.1M aqueous palladium sulfate solution is applied to the polymer-coated substrate for 3 minutes, followed by rinsing the substrate with deionized water for 20 seconds, and drying the substrate with pressurized nitrogen.

The use of a substrate coated with a polymer layer and a noble metal compound is well known in the art, see, e.g., Jackson U.S. Pat. No. 4,701,351, entitled "Seeding Process for Electroless Metal Deposition."

The complexed polymer is next selectively irradiated so that those regions exposed to localized heating will etch at a slower rate than the non-exposed regions during a subsequent chemical etch. While the preferred energy source is a continuous wave argon laser, numerous other sources of irradiation can be used, such as a frequency doubled Nd:YAG, krypton, or dye lasers, and conceivably particle beams or electron beams as well. In the preferred embodiment an argon laser selectively irradiates those regions where the metal interconnect pattern is desired. For instance, a continuous wave argon laser in the all lines mode can be used with 0.025 W beam power incident on the substrate, focused to form a gaussian-profile spot with 1/(e-squared) radius of 15 microns. A computer controlled X-Y stage can be used to scan the substrate relative to the fixed laser beam at a speed of 100 microns per second, for example, and thus apply a desired pattern of irradiation to the substrate.

After irradiation the substrate is exposed to a suitable chemical etchant in order to etch the irradiated regions at a slower rate than the non-irradiated regions. In the preferred embodiment the substrate is etched until the non-irradiated complexed polymer is removed, while little or none of the irradiated portions are etched. This can be accomplished, for example, by immersing the substrate in 1M NaOH (sodium hydroxide) for a time appropriate to the thickness of the polymer film, for instance 2 minutes for a 1.5 micron thick film. Another suitable etchant is KOH (potassium hydroxide). The substrate is then rinsed with deionized water for 30 seconds.

In the next step the substrate is exposed to a conventional electroless plating bath in order to deposit the metal in correspondence with the patterned complexed polymer. Upon completion of the electroless bath the desired metal interconnects and/or bond pads will adhere tightly to the substrate in the regions where the complexed polymer remained. The plating bath can be operated in the conventional manner, for instance, by having the bath heated to an appropriate temperature and agitated by mechanical stirring. While copper is the preferred metal to be plated, other suitable metals can be used, for instance nickel or gold.

Electroless plating solutions are used for the process disclosed herein in the same manner as for other industrial applications, though in a preferred embodiment of the invention, significantly thinner coatings may be used compared to the thickness of the coating required for prior art applications. The purpose of the electroless metal deposit is to function as a mask for the underlying photoresist during plasma development. For this purpose, a metal deposit having a thickness varying between 20 and 5,000 angstroms, preferably between 50 and 1,000 angstroms is adequate. This compares to a deposit having a thickness of several mils for most conventional industrial applications for electroless metal deposits such as those used in the formation of printed circuit boards where thick deposits are required for conductivity, not as a barrier or mask.

The ability to attain plasma protection using thin metallic deposits is an advantage of the process of the invention as significantly shorter deposition times are possible and/or dilute plating solutions that are easily controllable may be used. In this respect, deposition times may range from several seconds to several minutes while commercial plating solutions may be diluted by up to 20 or more times normal dilution for purposes of the invention.

The next step in the process of the invention comprises dry development of that portion of the photoresist coating remaining following wet development that is not protected by the metal mask. In this respect, even if wet development is used to fully develop the image, dry development is still desired to remove residual photoresist following development. Any plasma that attacks organic material is suitable. Plasmas based on oxygen attack organic film such as photoresists and are preferred for purposes of this invention. A preferred means for dry development involves the use of an oxygen containing reactive ion etch to achieve anisotropic development. Dry development is continued until all of the extraneous photoresist is removed.

Following dry development of the photoresist coating, the metal mask may be removed if desired such as by etching in acid, but for most processes, this step is not necessary and not desirable. Thereafter, the substrate bared by dry development of the photoresist coating may be altered in any desired way. Alteration may include etching, metal deposition, doping, etc. Etching is a common method of altering the substrate in semiconductor device manufacture. For example, a plasma can be used for etching a semiconductor substrate and plasmas containing fluorine atoms, such as may be formed from $CF_4$, $SF_6$, or $NF_3$ may be used for etching silicon, silicon oxide or silicon nitride. Plasmas that produce chlorine and bromine atoms may also be used for this purpose, such as those based upon $Cl_2$, $Br_2$, $CCl_4$, a mixture of $Cl_2$ with $C_2F_6$, and similar compounds. Many metals are attacked by halogen plasmas, but by incorporation of a controlled amount of oxygen with the halogen containing gas, it is possible to etch silicon dioxide selectively in the presence of a mask such as nickel. Plasma etching of the substrate may immediately follow plasma etching without removal of the substrate from the etching chamber.

Details for plasma development and plasma etching are described in the literature including H. V. Boenig, *Plasma Science and Technology*, Cornell University Press, Ithaca, 1982; by J. A. Mucha and D. W. Hess, in *Introduction to Microlithography*, American Chemical Society, Washington, 1983; and by H. Kalter et al, *Plasma Etching in IC Technology*, Philips Tech. Rev. 38, No. 7/8, pp. 200 to 210, 1978/79, all incorporated herein for their teachings of known methods for plasma development and etching.

Following plasma etching, the metal mask if not previously removed, and the underlying photoresist coating may be wet stripped with a conventional remover for the photoresist. If the metal mask was not removed, the dissolution of the photoresist results in lift off of the metal mask over the photoresist coating. Conventional solvents, or strippers as they are known in the art, are commercially available.

Alternatively, if desired, instead of coating the substrate with a polymer and then contacting the polymer with a noble metal compound in a two-step process, a one-step process can be used in which the substrate is coated with a polymer-noble metal compound mixture in a single step. The polymer-noble metal compound mixture forms a complexed polymer, so the one-step process could also be described as coating the substrate with a complexed polymer in a single step. The one-step process is the same as the two-step process in all other respects and the same results are achieved.

In an alternative embodiment of the present invention, the substrate can be immersed in a polymer solution that complexes with a noble metal compound, and then selectively irradiated before it is contacted with the noble metal compound. When irradiating with a focused laser beam, a bubble is generated in the solution at the focal spot. The polymer will then be deposited on the substrate in a thin film only where the localized heating and subsequent bubble occur. The substrate is then removed from the polymer solution and cleaned so that the remaining polymer forms a pattern where it was deposited by the local heating. Thereafter the patterned polymer is contacted with a noble metal compound so that the pattern becomes catalytic to a subsequent electroless bath. One advantage of this embodiment is that the wet chemical etching step is eliminated. Another advantage is that the noble metal compound is absorbed only where the polymer is deposited by irradiation and the electroless bath metal is eventually plated. This economic use of the noble metal compound is especially important in the case of palladium, which is quite expensive.

In this embodiment, a preferred method is to immerse the substrate in poly(acrylic acid) solution and then selectively irradiate the immersed substrate with a continuous wave argon laser similar to that used in the previous embodiment. Those regions of the substrate where the irradiation causes localized heating will cause a thin film of the polymer from the solution to be selectively deposited. After completion of the irradiation the substrate is removed from the poly(acrylic acid) solution, and the residual polymer solution is removed, for instance, by rinsing with deionized water for 30 seconds. Then the deposited patterned polymer is contacted with 0.1M palladium sulfate for 3 minutes, and then the substrate is rinsed again in deionized water for 30 seconds. Finally, the complexed polymer is exposed to a conventional electroless plating bath to form the desired metallization pattern corresponding to the complexed polymer.

The present invention will be illustrated further by the following examples. These examples are meant to illustrate and not to limit the invention, the scope of which is defined solely by the appended claims.

EXAMPLE 1

A multi-chip packaging substrate, consisting of a silicon wafer coated with several layers of polyimide (total thickness approximately 30 microns) and copper features prepatterned by conventional methods, may be cleaned in an oxygen plasma for 2.5 kW-minutes. The substrate may then be covered with a 1 millimeter thick liquid film of 1% aqueous poly(acrylic acid) (molecular weight 250,000) and subsequently allowed to dry in a horizontal position in air for 1 hour. A solid layer of poly(acrylic acid) approximately 1.5 microns thick would form on the substrate. Next the substrate would be covered with 0.1M palladium sulfate for 3 minutes, then rinsed with deionized water for 20 seconds and dried with pressurized nitrogen at room temperature for 10 seconds. The substrate would then be irradiated in various patterns at a horizontal scan rate of 100 microns per second with a focused continuous wave argon laser in all-lines mode with an incident beam power of 0.025 W and a 1/(e squared) beam radius of approximately 15 microns. The irradiated areas would have complexed poly(acrylic acid) over both the polyimide and the copper features on the polyimide. The patterns would mostly be configured to connect the previously isolated copper features. The substrate may next be etched in 1M aqueous NaOH at room temperature for 2 minutes and then rinsed with deionized water for 30 seconds. Finally the substrate would be exposed to a Shipley CUPOSIT ® 385 copper electroless plating bath.

EXAMPLE 2

A multi-chip packaging substrate similar to that in example 1 would be cleaned in an argon plasma for 2.5 kW-minutes. The substrate would then be immersed in 2% poly(acrylic acid (molecular weight 250,000) in glycerol. Next the immersed substrate may be irradiated in a cross-line pattern at a horizontal scan rate of 100 microns per second with a focused continuous-wave argon laser in all-lines mode with an incident beam power of 0.025 W and a 1/(e squared) beam radius of approximately 15 microns. The substrate containing patterned polymer would then be removed from the poly(acrylic acid) and rinsed with deionized water for 30 seconds, covered with 0.1M palladium sulfate for 3 minutes, and rinsed again with deionized water for 20 seconds. Finally the substrate would be exposed to a Shipley NIPOSIT ® 468 nickel electroless plating bath. Desirable conditions for deposition of NIPOSIT ® 468 electroless nickel include 5% strength at a temperature of 30° C. without agitation for a period of 4.5 to 7.5 minutes. A significantly shorter time leads to a nickel mask which would be noncontinuous and therefore unable to fully protect the photoresist from reactive ion etching with an oxygen plasma. A significantly longer time would lead to a rough nickel deposit with inferior resolution. Optimum results would be obtained with 5.5 minutes of deposition time which exemplifies the most preferred embodiment of this invention. The average thickness of the nickel deposit would be on the order of 0.01 micron; i.e., somewhat thicker than the particle diameter of the colloidal catalyst used as the plating catalyst, which is known to be primarily in the range 0.005 to 0.01 micron. The extreme thinness of this nickel deposit permits precise definition of its edges, with minimum nodularity, while still affording protection against an oxygen containing reactive ion etchant (RIE).

To test the efficacy of the nickel films for protection of the photoresist, the wafer would be subjected, first to RIE with oxygen in order to remove the photoresist in the unprotected portions, and then to a halogen containing plasma to etch the silicon dioxide. The nickel layer protects the photoresist (together with underlying substrate) during anisotropic etching, both by an oxygen RIE and by an etchant for silicon dioxide. This establishes the feasibility of this embodiment of the invention.

The present invention is therefore well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

I claim:

1. A process for altering the surface of a substrate comprising the steps of:
    (a) coating the substrate with a layer of a polymer capable of complexing with a noble metal compound;
    (b) contacting the layer of polymer with a noble metal compound to form a complexed polymer;
    (c) selectively irradiating the complexed polymer in a predetermined pattern;
    (d) etching the complexed polymer whereby the irradiated portions of the complexed polymer etch at a slower rate than the non-irradiated portions of the complexed polymer;
    (e) electrolessly depositing metal over the complexed polymer to form a metal mask; and
    (f) dry developing said coated substrate.

2. The process of claim 1 including the step of altering the surface of the substrate bared by dry development.

3. The process of claim 1 wherein the polymer is selected from the group consisting of poly(acrylic acid) and polyacrylamid.

4. The process of claim 1 wherein the noble metal compound is a palladium salt.

5. The process of claim 1 wherein the source of irradiation is a laser beam.

6. The process of claim 1 wherein the electroless plating metal is selected from the group consisting of copper, nickel and gold.

7. The process of claim 1 wherein the thickness of the electroless metal mask is at least 50 angstroms.

8. The process of claim 7 wherein the thickness varies between 50 and 1,000 angstroms.

9. The process of claim 1 wherein the step of dry development is by anisotropic reactive ion etching.

10. The process of claim 2 wherein the substrate is a semiconductor.

11. The process of claim 10 wherein the substrate is altered by implantation.

12. A process for altering the surface of a substrate comprising the steps of:
    (a) coating the substrate with a layer of a complex of a polymer and a noble metal;
    (b) selectively irradiating the complexed polymer in a predetermined pattern;
    (c) etching the complexed polymer whereby the irradiated portions of the complexed polymer etch at a slower rate than the non-irradiated portions of the complexed polymer;
    (d) electrolessly depositing metal over the complexed polymer to form a metal mask; and
    (e) dry developing said coated substrate.

13. The process of claim 12 including the step of altering the surface of the substrate bared by dry development.

14. The process of claim 12 wherein the polymer is selected from the group consisting of poly(acrylic acid) and polyacrylamid.

15. The process of claim 12 wherein the noble metal compound is a palladium salt.

16. The process of claim 12 wherein the source of irradiation is a laser beam.

17. The process of claim 12 wherein the electroless plating metal is selected from the group consisting of copper, nickel and gold.

18. The process of claim 12 wherein the thickness of the electroless deposit is at least 50 angstroms.

19. The process of claim 18 wherein the thickness varies between 50 and 1,000 angstroms.

20. The process of claim 12 wherein the step of dry development is by anisotropic reactive ion etching.

21. The process of claim 13 wherein the substrate is a semiconductor.

22. The process of claim 21 wherein the substrate is altered by implantation.

* * * * *